United States Patent [19]

Foster

[11] 3,739,242

[45] June 12, 1973

[54] TRIAC

[75] Inventor: Alan Foster, Stockport, Cheshire, England

[73] Assignee: U.S. Phillips Corporation, New York, N.Y.

[22] Filed: Feb. 15, 1972

[21] Appl. No.: 226,461

[30] Foreign Application Priority Data

Mar. 1, 1971 Great Britain .................... 5,711/71

[52] U.S. Cl. .... 317/235 R, 317/234 N, 317/235 P, 317/235 AB

[51] Int. Cl. .......................................... H01l 11/10

[58] Field of Search .................. 317/234 N, 235 P, 317/235 AB; 307/305

[56] References Cited

UNITED STATES PATENTS 3,317,746 5/1967 Hutson ........................ 317/235 AB

*Primary Examiner*—Jerry D. Craig
*Assistant Examiner*—William D. Larkins
*Attorney*—Frank R. Trifari

[57] ABSTRACT

A five layer triac, having three electrodes, with one electrode covering the whole surface of one side of the wafer, and the other two electrodes being symmetrically located on the other side of the wafer, the two smaller electrodes being identical so that either may be used as the gate and the other as the second main power electrode.

9 Claims, 10 Drawing Figures

TRIAC

This invention relates to bilateral gate controlled semiconductor devices.

Semiconductor devices comprising a semiconductor body having four successively arranged regions of alternating conductivity type defining three p-n junctions therebetween and electrodes on the outer two regions are known. Such two-terminal devices may be referred to as diode thyristors. A further development of such devices is the gate controlled thyristor or silicon controlled rectifier in which a third, gate electrode is present on one of the two intermediate regions. In the operation of these devices a relatively small voltage applied at the gate electrode can switch the device from a high impedance, non-conductive state to a low impedance, conductive state when a suitable forward voltage is applied between the electrodes on the outer two regions. A small current applied to the gate electrode initiates the flow of a much greater current through the device between the main current carrying electrodes on the outer two regions. These devices are unilateral in that with alternating current applied across the main current carrying electrodes the device can exist in the low impedance, conductive state only in one half cycle of the applied alternating current. In order to provide full-wave power control two or more thyristors have to be used or the alternating source must be rectified to provide a pulsating unidirectional wave.

Semiconductor devices suitable for full wave power control of an alternating current are known and comprise a semiconductor body having five successively arranged regions of alternating conductivity type having three p-n junctions therebetween. The body has an inner zone of one conductivity type between first and second outer zones of the opposite conductivity type extending at first and second opposite sides of the body and forming p-n junctions with the inner zone, the first and second outer zones respectively being in ohmic contact with first and second main current carrying electrodes at said first and second opposite sides of the body. First and second further zones of the one conductivity type form p-n junctions with the first and second outer zones respectively and extend at said first and second opposite sides of the body respectively in ohmic contact with the first and second main current carrying electrodes. These devices are bilateral and can exist in a conductive state in both directions of an alternating supply connected across the main current carrying electrodes. There exist various forms of these devices which differ in respect of the gate control means present for rendering the device conductive.

FIG. 1 of the accompanying diagrammatic drawings is a schematic cross-section of one known form of a bilateral gate controlled semiconductor device. The device comprises a semiconductor body having an inner n-type zone 1 situated between first and second outer p-type zones 2 and 3 extending at first and second opposite sides of the body and forming p-n junctions $J_1$ and $J_2$ respectively with the inner n-type zone 1. A first further n-type zone 4 forms a p-n junction $J_3$ with the first outer p-type zone 2 and extends at the same, one side of the body as said p-type zone 2. A second further n-type zone 5 forms a p-n junction $J_4$ with the second outer p-type zone 3 and extends at the same, opposite side of the body as said p-type zone 3. The third further n-type zone 6 forms a p-n junction $J_5$ with the second outer p-type zone 3 and also extends at the same side of the body as the p-type zone 3. At the first side of the body there is shown another n-type zone 12 which extends at the first side of the body and forms a p-n junction $J_6$ with the first outer p-type zone 2. In practice the zones 4 and 12 normally form a common zone but for the purpose of the explanation of the operation of the device these are shown as separate zones. Also because the common zone 4, 12, has a complex shape at the first side of the body when taking some sections through the body it appears that two separate zones 4 and 12 are present.

At the said one side of the body there is a first main current carrying electrode 7 in ohmic contact with the p-type outer zone 2 and the n-type zones 4 and 12 and thus shorting parts of the junctions $J_3$ and $J_6$ where they extend to the surface. Electrode 7 is connected to main current carrying terminal $T_1$ of the device. At the opposite side there is a second main current carrying electrode 8 in ohmic contact with the p-type zone 3 and the n-type zone 5 and shorting part of junction $J_4$ where it extends to the surface. Electrode 8 is connected to main current carrying terminal $T_2$ of the device. Also at this side of the body there is a gate electrode 9 which forms a common ohmic contact to the p-type zone 3 and the n-type zone 6 and thus shorting part of the junction $J_5$ where it extends to the surface. Electrode 9 is connected to a gate terminal G of the device. With respect to the direction between the opposite major sides of the body the n-type zones 4 and 5 are in overlapping relationship as also are the n-type zones 5 and 12. Operation of the device may be considered separately in the two half cycles of an alternating supply connected across terminals $T_1$ and $T_2$. Considering the structure without the n-type zone 6 and gate electrode 6, in the first half cycle with $T_1$ positive and $T_2$ negative then after exceeding the breakover voltage of junction $J_2$ conduction between the electrodes 7 and 8 would occur via the n-p-n-p thyristor structure in the centre of the device section shown and constituted by the successively arranged zones 5, 3, 1, 2 and in the other half cycle with $T_1$ negative and $T_2$ positive then after exceeding the breakover voltage of junction $J_1$ conduction between the electrodes 7 and 8 would occur via the p-n-p-n thyristor structure on the left-hand side of the device section shown and constituted by the successively arranged zones 3, 1, 2, 4. The n-type zones 6 and 12 and the gate electrode 9 are provided so that, in contradistinction to the above described operation which assumes the absence of these zones and electrode, the initiation of current flow in either half cycle can be controlled and is not dependant on the externally applied voltage exceeding the breakover voltages of junctions $J_2$ and $J_1$. The particular form of gate controlled device shown in FIG. 1 is such that in either the first quadrant or third quadrant current flow can be initiated by applying a voltage to terminal G which is either positive or negative with respect to the voltage applied to terminal $T_2$. This form of three-terminal bilateral gate controlled device, known as a TRIAC, is the most commonly produced commercial type. Other types exist in which due to a different configuration of the n-type zone 6 and/or the gate electrode 9 the trigger mechanism and/or the triggering possibilities of applied voltage polarity differ from the structure shown in FIG. 1. For example three-terminal devices can be formed in which triggering in the first or third quadrants can only be effected using a voltage of one polarity only applied to the gate with respect to the voltage applied to $T_2$.

The electrical characteristics of the device shown in FIG. 1 are shown diagrammatically in FIG. 2 of the accompanying drawings which is a plot of the voltage V against the current I between the terminals $T_1$ and $T_2$. In the first quadrant (top right-hand portion with $T_1$ positive and $T_2$ negative) at zero gate bias there is a slow rise in output current, the device being in the non-conductive state. On further rise in applied voltage to the breakover voltage $V_{B_1}$ there is a transient negative resistance region in the characteristic shown by the dotted line. The device then switches into the conducting state to a current set by the circuit impedance. If the current is then reduced the device finally switches off at the holding current $I_{H_1}$ level as the injected charge becomes insufficient to maintain the inner two zones of the relevant four zones thyristor structure in saturation. In the third quadrant (bottom left-hand portion with $T_1$ negative and $T_2$ positive) the characteristic is generally symmetrical with that in the first quadrant. In both first and third quadrants the application of a low voltage to terminal G which is either positive or negative with respect to the voltage on $T_2$ will trigger the device from the non-conductive to the conductive state. These modes of triggering are known as the $I^+$, $I^-$, $III^+$ and $III^-$ modes, where $I^+$ means triggering in the first quadrant ($T_1$ positive, $T_2$ negative) with a positive gate voltage with respect to $T_2$, $I^-$ means triggering in the first quadrant with a negative gate voltage with respect to $T_2$, $III^+$ means triggering in the third quadrant ($T_1$ negative, $T_2$ positive) with a positive gate voltage with respect to $T_2$, and $III^-$ means triggering in the third quadrant with a negative gate voltage with respect to $T_2$.

When either four-zone thyristor structure 5, 3, 1, 2 or 3, 1, 2, 4, is turned on by applying a suitable potential to the gate electrode 9 it is not necessarily the most sensitive region which turns on first. The initial area of turn-on may require more current to hold it in the conducting state than that automatically found by slowly extinguishing a larger area of conduction until the last, most sensitive point turns off. Furthermore, in the first moments after turn-on, the device has not built up its final pattern of stored charge in the inner two zones of the relevant four-zone thyristor structure. In view of these two mechanisms it is necessary to initiate conduction to a level above $I_H$ before the applied potential on the gate electrode can be removed. The safe level is known as the latching or pick-up current. Since for each of the four different modes of triggering a different region is initially turned-on, each will be associated with its own latching current.

Thus it is clear that the known triac device shown in FIG. 1 has four gate currents, two holding currents and four latching currents.

In manufactured devices as shown in FIG. 1 the surface geometry of the n-type regions which extend at the opposite sides of the body and their overlap is relatively complex. Basically with respect to the shape of the semiconductor body two forms of commercial triac exist. In one of these the body is generally rectangular and the orientation of the n-type regions which extend at the opposite sides of the body is with respect to the sides of the rectangular body as also is the orientation of the electrodes corresponding to electrodes 8 and 9 in FIG. 1. In the other form the body is in the form of a disc with a rather complex arrangement of the n-type regions and their overlap at opposite sides of the disc, the gate electrode (9 in FIG. 1) being provided at the centre of one side of the disc and the main current carrying electrode (8 in FIG. 1) being provided as an annulus surrounding the centre gate electrode. In the manufacture of the devices it is desirable for economic reasons to carry out such operations as diffusion to form a plurality of triac elements in a single semiconductor slice and subsequently divide these from the slice before mounting individually. The disc form of body for each triac element can be used, the division into discs from the slice being by way of ultrasonic cutting. However this technique is best suited to relatively high current, large area devices as the number of disc-shaped triac elements that can be produced on one slice is limited. For relatively low current, small area devices the rectangular form of semiconductor body is the obvious choice as the possibility exists of obtaining economically a large plurality of triac elements from a single slice of material. However when dealing with such elements of relatively small area a problem of contacting and handling becomes apparent. This is because the gate electrode and main current carrying electrode at one side of the body are extremely small and as they contact different regions of the body they must be separately identified and maintained as such in the manufacturing operations subsequent to division of the slice. This leads to high costs not only in the handling of the bodies but also in the encapsulation where the gate terminal and the main current carrying terminal to said main current carrying electrode must be dissimilarly provided. For the purpose of cost reduction in manufacture and possibly also of simplicity in use it would be desirable to provide a structure of a bilateral gate controlled semiconductor device in which the electrical connections to gate electrode and the main current carrying electrode at the same side of the semiconductor body are interchangeable and yet the device has substantially the same characteristics for each of the two different connections.

According to the invention a bilateral gate controlled semiconductor device comprises a semiconductor body having an inner zone of one conductivity type between first and second outer zones of the opposite conductivity type, said first and second outer zones of the opposite conductivity type extending at first and second opposite sides of the body respectively and forming p-n junctions with the inner zone, a first further zone of the one conductivity type forming a p-n junction with the first outer zone of the opposite conductivity type and also extending at said first side of the body, a first main current carrying electrode at said first side of the body in ohmic contact with said first outer zone of the opposite conductivity type and said first further zone of the one conductivity type, second and third further zones of the one conductivity type of substantially equal surface areas each forming a p-n junction with the second outer zone of the opposite conductivity type and each extending at said second side of the body, two further electrodes at said second side of the body for constituting a second main current carrying electrode and a gate electrode or vice versa according to the circuit connection of these electrodes, one of said further electrodes forming a common ohmic contact to the second outer zone of the opposite conductivity type and the second further zone of the one conductivity type and the other of said further electrodes forming a common ohmic contact to the second outer zone of the opposite conductivity type and the third further zone of the one conductivity type, the shape and position of the first further zone of the one conductivity type at the first side of the body and the second and third further zones of the one conductivity type at the second side of the body being such that the device has substantially the same characteristics for each of the two alternative circuit connections of the two further electrodes.

In this device having the said same characteristics for the two alternative circuit connections due to the provision of said second and third further zones of the one conductivity type of substantially equal surface areas and the appropriate design of their shape and position with respect to the first further zone of the one conductivity type at the said one side of the body, significant cost reductions may be made in manufacture and if desired, further constructional features may be employed to simplify the use of the device. Dealing first with the latter possibility, because either of the two electrodes at the second side of the body can constitute the gate electrode, the other of said electrodes constituting a main current carrying electrode, the encapsulation of the semiconductor body can be relatively simple as it is not necessary to distinguish between the terminals connected to these electrodes. Furthermore the choice of the terminal for the gate can be left to the user in an encapsulation which has two similarly provided terminals at one side of the envelope for use as gate and one main terminal, and one terminal at a further side of the envelope for use as the other main terminal.

However by far a more important advantage of the particular structure of the device in accordance with the invention is that of cost reduction that can be obtained in manufacture due to the particular structure. Although within the scope of the invention as defined in the appended claims there are included devices in which the semiconductor body is in the form of a disc, the particular advantage in cost reduction of manufacture is manifest in those devices in which the semiconductor body is of generally rectangular surface configuration. This is because the application of the two electrodes at the said second side of the body may be performed in a relatively simple manner as will be described hereinafter.

Thus in one preferred form of a bilateral gate controlled semiconductor device in accordance with the invention the semiconductor body is of generally rectangular surface configuration, the second and third further zones of the one conductivity type where they extend at the second side of the body being substantially symmetrically disposed with respect to a line which bisects the rectangular surface at said second side. In this form advantages arise in manufacture because the two electrodes at the said second side can be provided in the form of metal layer strips extending substantially parallel to said line. With such electrodes in the form of metal layer strips, when forming a plurality of device elements on a single slice the electrode contact pattern applied to the whole slice can be a plurality of parallel strips. This enables a large cost reduction to be made because the masking required in forming the contact pattern is very simple and may be effected using the relatively cheap technique of wax spraying through a metal mask in which strip-like apertures have been formed by spark erosion. In connection with applying contact patterns in the form of a plurality of substantially parallel metal layer strips reference is invited to our co-pending U.S. Pat. Application Ser. No. 230,265, filed Feb. 29, 1972. Also with the said preferred form the processing to form the first, second and third further zones of the one conductivity type may be relatively simple because wax spraying through metal masks having apertures formed by spark erosion may also be used in defining masking patterns required when forming openings in surface insulating layers, at the opposite sides of the body, diffusion of an impurity element characteristic of the one conductivity type being effected subsequently into the surface portions exposed by the openings and to form said first, second and third further zones of the one conductivity type.

In a preferred form of a device in accordance with the invention having a semiconductor body of generally rectangular surface configuration the second and third further zones of the one conductivity type where they extend at the second side of the body are substantially symmetrically disposed with respect to a diagonal line between opposite corners of the rectangular surface at said side. In this form advantages arise, not only in the manner in which the contacts may be applied, but also in that it is possible to produce a part of the second outer zone of the opposite conductivity type between the adjoining portions of the second and third further zones of the one conductivity type which has a large length in the direction parallel to the diagonal line. In fact for a body of square outline this part of the second outer region may have a maximum length which approaches $\sqrt{2}$ times the side length whereas for such a body of square outline in which the symmetry of the said second and third further zones of the one conductivity type is about a bisecting line extending parallel to opposite sides of the square the said part of the second outer region of the opposite conductivity type may have a maximum length which is significantly less than the side length and usually at most only half the side length. This is important for the sensitive triggering of the device and will be described in further detail hereinafter.

In the said preferred form of the device in which the second and third further zones of the one conductivity type where they extend at the second side of the body are substantially symmetrically disposed with respect to a diagonal line between opposite corners of the rectangular surface at the second side, the two further electrodes at the second side may be in the form of metal strips of substantially uniform width which extend in a direction substantially parallel to the diagonal line. In the stage of manufacture of this device in which the metal strip electrodes are applied, the contact pattern for a plurality of device elements on a single slice will consist of a plurality of metal strips extending parallel to the said diagonal lines of each of the elemental body areas. The provision of such diagonally orientated electrodes has the further advantage that a larger area for contacting, for example by thermocompression bonding, is provided than would be the case for side orientated electrodes.

In the said preferred form of the device in which the second and third further zones of the one conductivity type are symmetrically disposed with respect to the diagonal line, these zones each may have a first peripheral portion and a second peripheral portion, the p-n junction parts between the first peripheral portions and the second outer zone of the opposite conductivity type extending on opposite sides of and in a direction substantially parallel to the diagonal line and the p-n junction parts between the second peripheral portions and the second outer zone extending on opposite sides of and in a direction away from the diagonal line, and with respect to the direction between the first and second sides of the body and said first peripheral portions are in overlapping relationship with the first further zone of the one conductivity type at the first side of the body and the said second peripheral portions at least for a part of their length extending adjacent the first peripheral portions are in non-overlapping relationship with the first further zone of the one conductivity type at the first side of the body. By this localising of the region of overlap of the zones of the one conductivity type at opposite sides of the body the commutation speed capability is increased by having the lowest possible current density in the vicinity of the overlap. Furthermore by providing this form of localised overlap sensitive triggering of the device is possible, particularly in the $III^+$ mode. For a full description of the localised overlap in a bidirectional gate controlled semiconductor device reference is invited to U.S. Pat. No. 3,696,273. Reference to the said second peripheral portions being in non-overlapping ralationship with the first further zone of the one conductivity type is to be understood to include herein the case when with respect to the direction between the first and second sides of the body the said zones are in spaced relationship but also the case when the spacing is substantially zero. The latter possibility, which may be a requirement imposed by the manufacturing procedures involved and other design considerations, may not provide such a large increase in commutation speed capability as in the case where the said zones are in spaced relationship with respect to the direction between the first and second sides of the body but nevertheless an improvement thereof will result.

In the device having the said localised overlap, with respect to the direction between the first and second sides of the body each further electrode at the second side of the body may be laterally spaced from the area of overlap of the first further zone of the one conductivity type at the first side of the body with the first peripheral portion of the respective second or third further zone of the one conductivity type at the second side of the body contacted by the respective electrode. This effectively puts a high resistance in the current path from the electrode to the region of overlap. When one of said two electrodes constitutes a main current carrying electrode and the device is in the conducting state with the applied voltage polarity being such that the respective second or third further zone of the one conductivity type constitues the outer emitter zone of one four zone structure through which the main current flow occurs between the main current carrying electrodes with said applied voltage polarity, the highest current density is in the direct shadow of the said one of the two electrodes and in this area the respective second or third further zone of the one conductivity type at the second side of the body does not overlap the first further zone of the one conductivity type at the first side of the body. As the area of overlap is in the vicinity of the other electrode at the second side of the body, access of carriers characteristic of the one conductivity type from the respective second or third further zones of the one conductivity type to the area of overlap is via the relatively high impedance part of said respective second or third further zone of the one conductivity type which is not covered by the main current carrying electrode. The current density is therefore very low in the area of overlap, so reducing to a minimum the stored charge in the inner zone of the one conductivity type in that area. This minimal stored charge soon recombines thus permitting high switching speeds.

In the said preferred form of the device in which the second and third further zones of the one conductivity type where they extend at the second side of the body are substantially symmetrically disposed on opposite sides of the diagonal line, these further zones each may have a penisular portion , said peninsular portions extending generally parallel to the diagonal line in opposite directions and defining between the second and third further zones of the one conductivity type a portion of the second outer zone of the opposite conductivity type having a larger dimension in the direction parallel to the diagonal line than in the direction transverse to the diagonal line. This particular structural feature provides for sensitive triggering because it provides a relatively long resistive path in the second outer region of the opposite conductivity type for charge carriers characteristic of the opposite conductivity type which travel in the surface adjacent portion of the second outer zone between the gate electrode at its contact with said zone and the main current carrying electrode at its contact with said zone. This purely resistive flow of current in the second outer region of the opposite conductivity type is a wasteful shunt path of current and needs to be minimised.

In the device in accordance with the invention having the peninsular portions the said second portion of the second outer zone of the opposite conductivity type defined by the peninsular portions may be of generally rectangular surface area at the second side of the body and the ratio $l/w$ is at least 6, where $l$ is the length of said portion measured in a direction parallel to the diagonal line between the ends of the peninsular portions and $w$ is the width of said portion of the second outer zone measured in a direction transverse to the diagonal line between the facing edges of the second and third further zones of the one conductivity type. The resistance of the wasteful shunt path is equal to the resistivity of the second outer zone of the opposite conductivity type multiplied by $l/w$. The resistivity is controllable within certain limitations but in a practical device $l/w$ must be at least 6 to produce sensitive trigger currents. The shorter current path in the second outer zone of the opposite conductivity type passing directly under the peninsular portions needs to be of much higher resistivity and this is achieved by control of diffusion gradients.

The first further zone of the one conductivity type at the first side of the body may have two recessed portions which with respect to the direction between the first and second sides of the body are situated in the proximity of the peninsular portions of the second and third further zones of the one conductivity type at the second side of the body. The reason for the provision of the recessed portions is as follows. Some of the triggering mechanisms of the device will initiate conduction at the end of one of the peninsular portions. The first further zone of the one conductivity type at the first side of the body effectively divides the first outer zone of the opposite conductivity type into two surface parts situated on opposite sides of the diagonal plane which are joined by the remainder of the region not penetrated by the first further zone of the one conductivity type. The triggering will be from the end of a peninsular portion of one of the second or third further zones of the one conductivity type at the second side of the body to the first outer zone of the opposite conductivity type at the one side of the body. It is essential that this current flow is to the most adjacent underlying portion of said first outer zone and which is situated on the same side of the diagonal plane as the peninsular portion for otherwise the main conduction path would be transverse and to the portion of the first outer zone on the opposite side of the diagonal plane and thus result in high dissipation. The provision of each recessed portion in the first outer zone of the one conductivity type effectively brings the most adjacent portion of the first outer zone of the opposite conductivity type and hence the region of conduction nearer to the relevant peninsular portion.

Embodiments of the invention will now be described, by way of example, with reference to FIGS. 3 to 9 of the accompanying diagrammatic drawings, in which:

FIGS. 3 and 4 respectively show the diffusion pattern at the upper side and the diffusion pattern at the lower side of the semiconductor body of a bilateral gate controlled semiconductor device in accordance with the invention;

FIGS. 5 and 6 respectively show for a different orientation of the semiconductor body shown in FIGS. 3 and 4 the upper side of the semiconductor body and the lower side of the semiconductor body after application of electrode layers at the upper side and lower side respectively;

Figure 1:
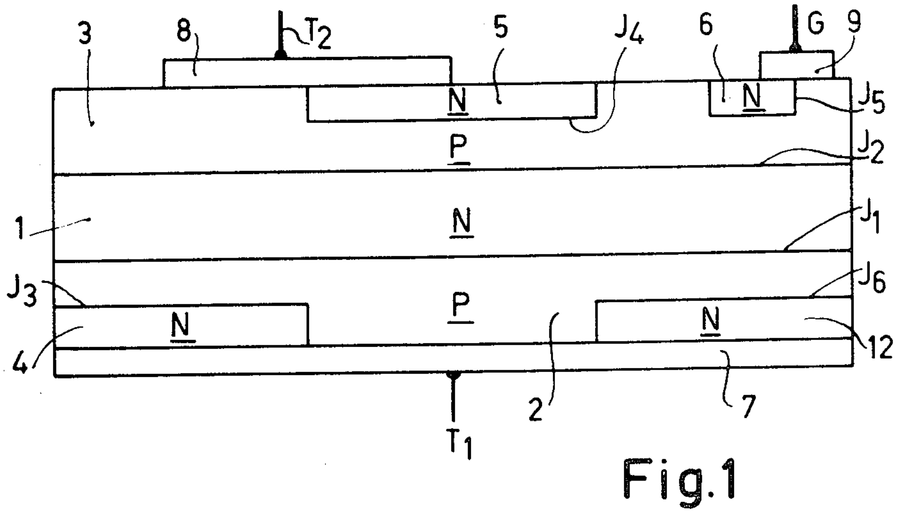
Figure 2:
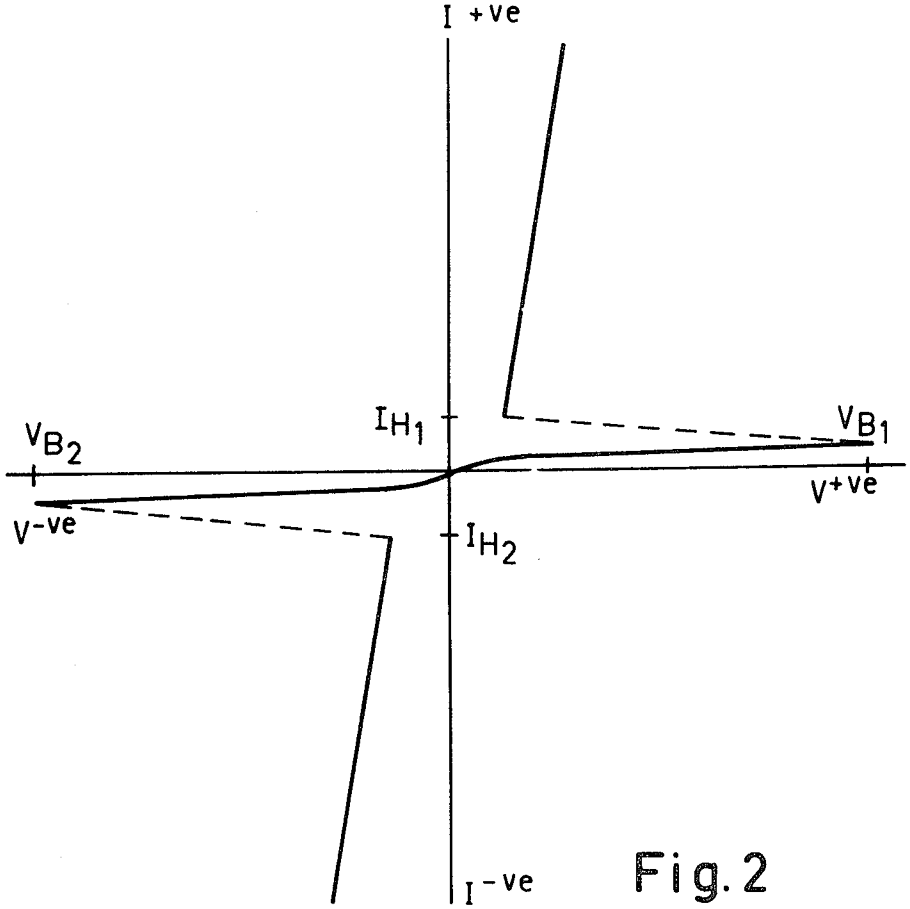

The semiconductor device shown in FIGS. 3 to 9 is a novel form of triac for use at 8 amps (RMS) or less.

The device comprises a wafer-shaped semiconductor body of silicon of square outline of 2.5 mm × 2.5 mm × 230 microns thickness. The body has an inner n-type zone 21 (FIGS. 7 and 8) of 110 microns thickness, and diffused first and second outer p-type zones 22 and 23 respectively each of 60 microns thickness which extend respectively at the lower side and upper side of the silicon body and form p-n junctions $J_1$ and $J_2$ respectively with the inner n-type zone 21. A first further n-type zone 24 of 15 microns thickness forms a p-n junction $J_3$ with the first outer p-type zone 22 and extends at the lower side of the silicon body. Second and third further n-type zones 25 and 26 form p-n junctions $J_4$ and $J_5$ respectively with the second outer p-type zone 23 and both extend at the upper side of the silicon body.

The junctions $J_1$ and $J_2$ extend completely across the semiconductor body and terminate in the side surfaces. The junction $J_3$ terminates partly in the side surfaces and partly in the lower surface of the silicon body, the latter termination being shown by the broken lines referenced $J_3$ in FIGS. 4 and 6. The junctions $J_4$ and $J_5$ terminate partly in the side surfaces and partly in the upper surface of the silicon body, the latter terminations being shown by the broken lines referenced $J_4$ and $J_5$ in FIGS. 3, 5 and 9.

Figure 3:
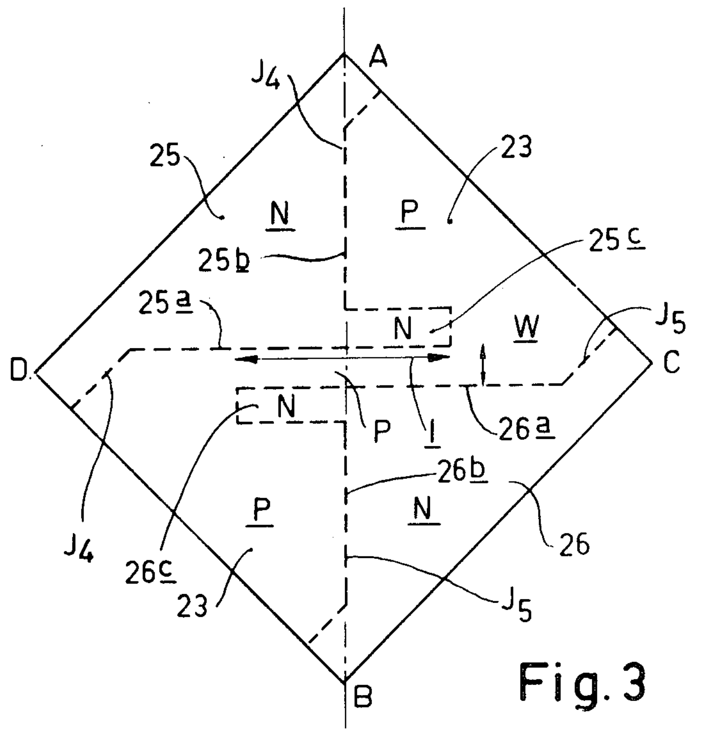
Figure 4:
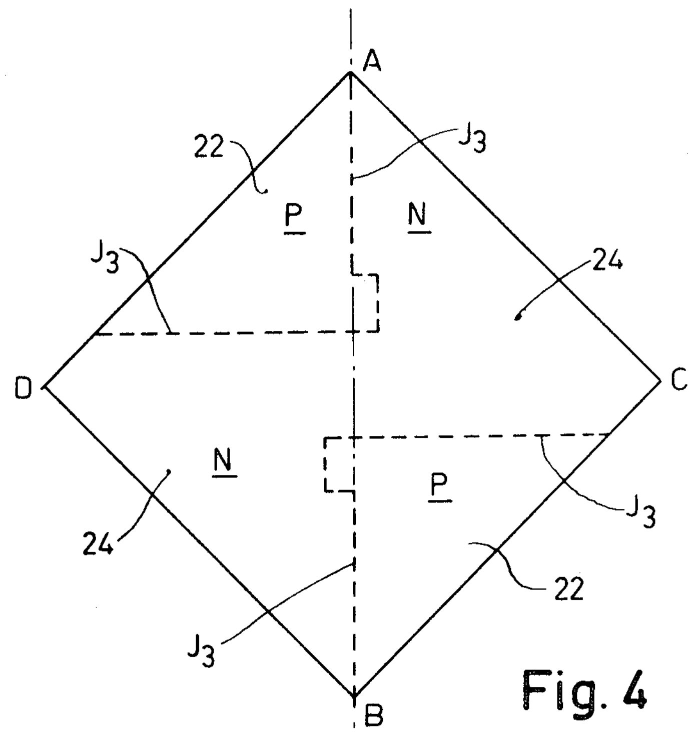
Figures 5, 6:
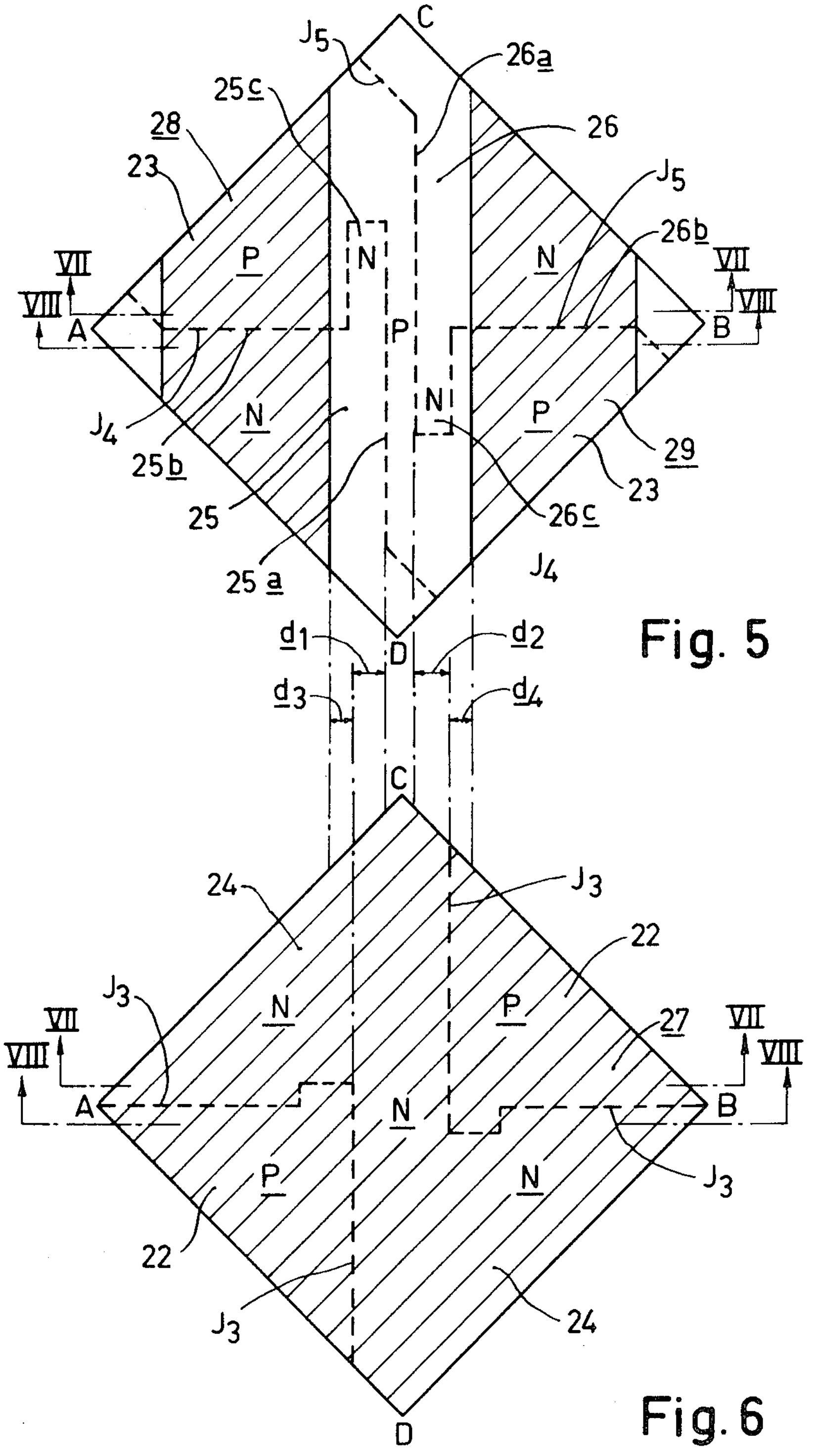
Figure 7:
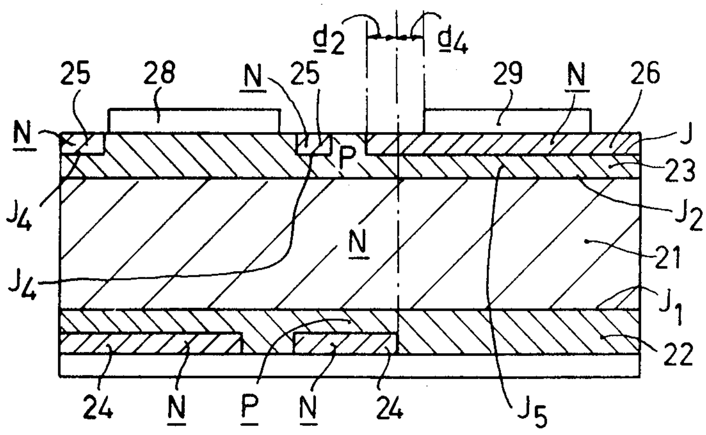
FIGS. 7 and 8 are vertical sectional views of the semiconductor body taken on the lines VII—VII and VIII—VIII respectively and shown both in FIGS. 5 and 6.
Figure 8:
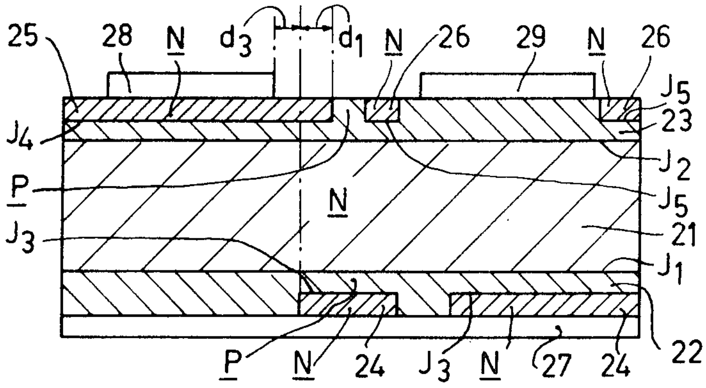

In each of FIGS. 3 to 6 inclusive the corners of the square silicon body are shown by references A, B, C and D. FIGS. 3 and 4 show the diffusion patterns at the upper and lower side respectively and both represent a view looking down on the body from the upper side. Thus if FIG. 3 is displaced along the adjoining vertical diagonal lines AB of FIGS. 3 and 4 until it is superimposed on FIG. 4 then this would represent a view of the body as seen from above. FIGS. 5 and 6 are similar to FIGS. 3 and 4 with the exception that they show additionally the electrode layers applied at the upper and lower sides of the body and with respect to the orientation of the drawings these Figures show a different orientation of the semiconductor body, that is with the adjoining diagonal lines CD vertical. By showing the two different orientations of the silicon body the relative situation of the first further n-type zone 24 with respect to the second and third further n-type zones 25 and 26 and the relative situation of the junction $J_3$ with respect to junctions $J_4$ and $J_5$ can be deduced and will be explained in further detail hereinafter.

From FIGS. 3 and 5 it is seen that the second and third further n-type zones 25 and 26 where they extend at the upper side of the body are symmetrically disposed with respect to the diagonal line CD between opposite corners of the surface. The electrode structure is as follows. On the lower side there is a metal layer electrode 27, indicated by the hatched shading in FIG. 6, which extends completely across the silicon surface at the lower side and consists of a plated layer of nickel of between 2 and 3 microns thickness having thereon a plated gold layer of less than 1 micron thickness. The electrode 27 thus forms at the lower side of the silicon body a common ohmic contact to the first outer p-type zone 22 and the first further n-type zone 24, the electrode shorting the junction $J_3$ where it extends at the surface and constituting a first main current-carrying electrode. On the upper side of the body there are two further metal electrodes 28 and 29 each in the form of metal layer strips also of nickel (2–3 microns) having gold (<1 micron) thereon. The strips are of 1.0 mm width and extend substantially parallel to the diagonal line C–D. The metal layer electrode 28 forms a common ohmic contact at the upper side of the silicon body to the second outer p-type zone 23 and the second further n-type zone 25, part of the junction $J_4$ where it terminates at the upper surface being shorted by the electrode 28. The metal layer electrode 29 forms a common ohmic contact at the upper side of the silicon body to the second outer p-type zone 23 and the third further n-type zone 26, part of the junction $J_5$ where it terminates at the upper surface being shorted by the electrode 29. Electrodes 28 and 29 together constitute a second main current-carrying electrode and a gate electrode and either of two alternative circuit connections for these electrodes is possible. Furthermore due to the particular situation of the n-type zones 25 and 26 of equal surface area with respect to the n-type zone 24 and their symmetry about the diagonal line C–Dx, the device has substantially the same characteristics for each of the two alternative circuit connections of the electrodes 28 and 29.

Consider first the operation of the device with electrode 28 connected as the gate electrode and electrode 29 connected as the second main current-carrying electrode. With such a circuit connection, on application of an alternating supply between the main current-carrying electrodes 27 and 29, when electrode 27 is negative with respect to electrode 29 current flow between these electrodes can occur, after triggering, via the n-p-n-p thyristor structure constituted by zones 24, 22, 21, 23 and when electrode 27 is positive with respect to electrode 29 current flow between these electrodes can occur, after triggering, via the p-n-p-n thyristor structure constituted by zones 22, 21, 23, 26. Thus the main current flow, that is the current flow between the electrodes 27 and 29 after triggering, with this circuit connection of the device occurs in the part of the body on the right-hand side of the diagonal line C–D.

Similarly, with the alternative circuit connection of the electrodes 28 and 29, that is with electrode 28 as the second main current-carrying electrode and electrode 29 as the gate electrode, on application of an alternating supply between the main current-carrying electrodes 27 and 28, when electrode 27 is negative with respect to electrode 29, current flow between these electrodes can occur, after triggering, via the n-p-n-p thyristor structure constituted by zones 24, 22, 21, 23 and when electrode 27 is positive with respect to electrode 28 then the current flow between these electrodes, after triggering, is via the p-n-p-n thyristor structure constituted by zones 22, 21, 23 and 25. Thus with this circuit connection of the electrodes 28 and 29, the main current flow after triggering occurs in the part of the body on the left-hand side of the diagonal line C– D.

For each of the two alternative circuit connections the device can be triggered in the first quadrant and in the third quadrant with positive or negative voltages on the gate electrode 28 or 29 with respect to the voltage on the main current-carrying electrode 29 or 28 respectively. Hence whereas the normal three terminal triac has two holding currents, four gate currents and four latching currents, this device can be considered to have four holding currents, eight gate currents and eight latching currents. The further encapsulation of the semiconductor body including the terminal connections to the semiconductor body are as follows. The semiconductor body is mounted with the electrode 27 secured on a centre terminal pad part of a comb used in standard outline form of plastic encapsulation known as SOT–35. Wires may be theremocompression bonded to the electrodes 28 and 29 and secured at their opposite ends to further terminal portions of the comb which extend on opposite sides of the centre terminal. Alternatively the connections between the electrodes 28 and 29 and the further terminal portions of the comb may be established via a secondary comb, the connections between end portions of the secondary comb and the electrodes 28, 29 being made by direct soldering. The semiconductor element thus mounted on and connected to the comb is encapsulated in plastics material. The underside of the pad part of the centre terminal on which the semiconductor body is mounted is coplanar with one of the faces of the envelope and provides good heat dissipation.

The other two terminals which are the second main current-carrying terminal and the gate terminal or vice versa project from the plastics material and may or may not be individually identified as the main terminal and gate.

The possibility of interchangeability is a direct consequence of the design features of the various regions in the semiconductor body. However, these design features also provide some advantageous effects, not only in the electrical characteristics of the device but also in the manufacture as will be described subsequently.

Referring particularly to FIGS. 3 and 4 and FIGS. 5 and 6, the second and third further n-type zones 25 and 26 respectively each have a first peripheral portion 25*a* and 26*a* respectively, and a second peripheral portion 25*b* and 26*b* respectively, the parts of junctions $J_4$ and $J_5$ between the first peripheral portions 25*a* and 26*a* and the second outer p-type zone 23 extending on opposite sides of the diagonal line C–D in a direction generally parallel to the diagonal line C–D and the parts of the junctions $J_4$ and $J_5$ between the second peripheral portions 25*b* and 26*b* extending on opposite sides of the diagonal line C–D and in a direction away from the diagonal line C–D. From FIGS. 5 and 6 and the section of FIG. 8, it is seen that with respect to the direction between the upper and lower sides of the body, the first peripheral portion 25*a* of the n-type zone 25 is in overlapping relationship with the n-type zone 24 at the lower side of the body. The amount of this overlap is indicated by the dimension '$d_1$' between FIGS. 5 and 6 and in the section of FIG. 8 and is approximately 0.2 mm. It is noted that in the vicinity of the corner D the overlap is greater. This latter area of greater overlap is not a design feature imposed by the desire for some improved electrical characteristics but is consequent upon the mask design used in the provision of the diffused n-type regions 25 and 26 which will be described in greater detail hereinafter.

Similarly the first peripheral portion 26*a* of n-type zone 26 is in overlapping relationship with the n-type zone 24 at the lower side of the body. This amount of overlap is indicated by the dimension '$d_2$' between FIGS. 5 and 6 and in the section of FIG. 7 and also is of approximately 0.2 mm. Similarly the overlap in the vicinity of the corner C is greater and again this is a function of the mask design used for producing the n-type diffused regions 25 and 26.

From FIGS. 3 and 4 it is seen that with respect to the direction between the upper and lower sides of the body, the second peripheral portion 25*b* of the n-type zone 25 is in non-overlapping relationship with the n-type zone 24 at the lower side of the body, in fact the lateral spacing is substantially zero as both the relevant parts of junctions $J_4$ and $J_3$ lie in a vertical plane containing the diagonal line A–B. Similarly the second peripheral portion 26*b* of the n-type zone 26 is in non-overlapping relationship with the n-type zone 24, the lateral spacing again being substantially zero as both the relevant parts of the junctions $J_5$ and $J_3$ lie in the vertical plane containing the diagonal line A–B.

With the particular localised areas of overlap of the second and third further n-type zones 25 and 26 at the upper side of the body with the first further n-type zone 24 at the lower side of the body optimum commutation speed capability consistent with sensitive turn-on facilities is achieved, particularly the triggering sensitivity in the III+ mode for either of the two circuit connections of the electrodes 28 and 29 is improved by this localised overlap.

A further feature of the structure which is related to the localised overlap concerns the location of the electrodes 28 and 29 with respect to the areas of overlap. From FIGS. 5 and 6 and the section of FIG. 8 it is seen that the inner edge of electrode 28 is laterally spaced by a distance '$d_3$' from the area of overlap of the n-type zones 25 and 24 and from FIGS. 5 and 6 and the section of FIG. 7 it is seen that the inner edge of electrode 29 is laterally spaced by a distance '$d_4$' from the area of overlap of the n-type zones 26 and 24. These distances '$d_3$' and '$d_4$' are each approximately 0.15 mm. These spacings effectively put a high series resistance, of approximately 0.2 ohms, in the current path in the zones 25 and 26 from the electrodes 28 and 29 to the overlap regions. These resistances are in series with the forward resistances in the overlap regions and are several times the values of the latter. This results in a reduction of the current densities in the regions of overlap.

The second and third further n-type zones 25 and 26 have peninsular portions 25c and 26c respectively, the peninsular portions extending generally parallel to the diagonal line C-D in opposite directions and defining between the n-type zones 25 and 26 a portion of the second outer p-type region of rectangular surface area whose length $l$ in the direction parallel to the diagonal line C–D is significantly larger than its width $w$ in the direction transverse to the diagonal line C–D (see FIG. 3). In the embodiment shown $l$ is 1.5 mm. and $w$ is 0.25 mm. so that the ratio $l/w$ is 6. The provision of the peninsular portions 25c and 26c and the elongated part of the p-type zone 23 therebetween provides for very sensitive triggering for either of the two alternative circuit connections of the electrodes 28 and 29. Thus considering for example the case where electrode 28 is the gate and electrode 29 is the second main current-carrying electrode. In the I+ mode electrode 29 is negative with respect to electrode 27 and a voltage is applied to gate electrode 28 which is positive with respect to the voltage on electrode 29. A wasteful current of holes flows from the gate electrode 28 via the p-type zone 23 to the main electrode 29. This flow of holes is possible via the elongated $l/w$ region between the peninsular portions 25c and 26c and is also possible in the p-type zone 23 via a shorter path under the n-type zones 25 and 26. However the p-type zone 22 is produced by a two stage diffusion so that the surface conductivity is much lower than the conductivity of that part of the region 22 under the n-type zones 25 and 26 so that the path under the n-type zones 25 and 26 is a high resistance path and thus the flow of holes may be preferentially via the elongated $l/w$ region between the n-type zones 25 and 26. By providing this portion of the region 23 in the elongated form the resistance may be made fairly high. This is desirable for the following reasons. In the mechanism for turning on the n-p-n-p structure on the right-hand side of the device formed by the regions 26, 23, 21 and 22 the n-type region 26 will only inject electrons into the underlying part of the p-type region 23 when the lateral voltage drop along the centre portion of the p-type zone 23 reaches the knee voltage of 0.8 volt. If the resistance of the centre portion of the p-type zone is only 10 ohms then the device will not be triggered until the current between electrode 28 and electrode 29 is 80 mA. However if the resistance is 100 ohms. then triggering will occur when the current between these electrodes is only 8mA.

As from the above it is clear that to achieve a high triggering sensitivity at low trigger currents it is desirable to have a long centre portion of the p-type region 23 between the n-type peninsular portions 25c and 26c, the orientation of the n-type zones 25 and 26 so that they are symmetrically disposed with respect to the diagonal line C–D is advantageous because with this orientation the dimension $l$ may be larger than would be the case when the n-type zones are symmetrically disposed with respect to a centre line extending parallel to opposite sides of the body.

The basic steps involved in the manufacture of the device shown in FIGS. 3 to 8 will now be described. The starting material is a disc of n-type silicon of 35 mm. diameter and 0.35 mm. thickness and of 25 ohm.-cm. resistivity. The slice is prepared to be flat on opposite major sides by lapping and etching prior to the first diffusion process. In the single slice there are to be formed some 70 to 80 of the elements as shown in FIGS. 3 to 8, operations such as diffusion, masking etc. being carried out simultaneously at all sites on the slice, the slice being divided into the individual bodies of square surface area subsequent to application of the electrode layers. However reference will now be made to the operations carried out at each single site. Diffusion of acceptor impurity is effected into opposite major surfaces of the slice to form the outer p-type zones 22 and 23 and the junctions $J_1$ and $J_2$ each of which is situated at a depth of approximately 60 microns from the adjacent surface. Preferably a two stage acceptor diffusion process is used in which aluminium is first diffused having a sheet resistance of greater than 200 ohms per square to provide the desired resistivity of the p-type region 23 to be located under the peninsular portions 25c and 26c and thereafter boron is diffused to give a high surface concentration which is necessary for providing good ohmic contacting of the electrodes to be applied subsequently.

By a process commonly employed in the semiconductor art, the disc is provided with a silicon oxide layer of approximately 1.3 microns thickness on all surfaces. Masking layers are then applied the oxide layer at opposite major sides of the disc, these layers having the patterns desired to obtain, by subsequent diffusion of phosphorus into the exposed silicon portions formed by local removal of the oxide layers at the apertures in the masking layers, the first further n-type zone 24 and the second and third further n-type zones 25 and 26. The masking layers may be formed using a photoresist which is defined by a photoprocessing method using photomasks. However as an alternative the process of wax spraying through metal masks may be employed. In the latter method, the areas of the oxide layers which are to be protected are coated with wax. Thereafter the non-covered parts of the oxide layers are etched, for example with hydrofluoric acid to expose the underlying silicon surface parts. The wax masking or remaining photoresist, as the case may be, is then removed. A phosphorus diffusion step is then carried out by a method commonly employed in the semiconductor art to form the n-type zones 24, 25 and 26. The junction depths of the n-type zones 24, 25 and 26 are approximately 15 microns in each case and the phosphorus surface concentration is approximately $10^{21}$ atoms/$cm^3$. During this phosphorus diffusion step a further oxide layer is formed on the exposed surface parts and the remaining parts of the initial oxide layers increase in thickness.

The electrode layers are than applied as follows. At the upper surface a masking pattern is applied on the surface oxide layer by wax spraying through a metal mask. The apertures in the mask consist of a plurality of parallel strips, the metal mask being applied so that the strips extending in a direction parallel to the diagonal lines C–D of the individual square sites at which the regions of each individual element have been formed. This mask of relatively simple form is produced by spark erosion. The wax is applied to the areas of the surface oxide layer which are to remain free of the metal contact strips. The unmasked areas of the surface oxide layer at the upper surface are then removed by etching with hydrofluoric acid. Simultaneously the oxide layer present on the opposite, lower side is removed with the hydrofluoric acid. Thereafter the wax masking layer at the upper side is removed. Electrode layers are then applied to the strip-form exposed silicon surface parts at the oxide masked upper surface and to the whole of the exposed lower surface by electroless plating first with nickel (2–3$\mu$) and then gold ($<1\ \mu$). In this manner a plurality of parallel extending metal layer electrode strips are formed on the upper surface and a continuous electrode layer is formed on the lower surface.

Figure 10:
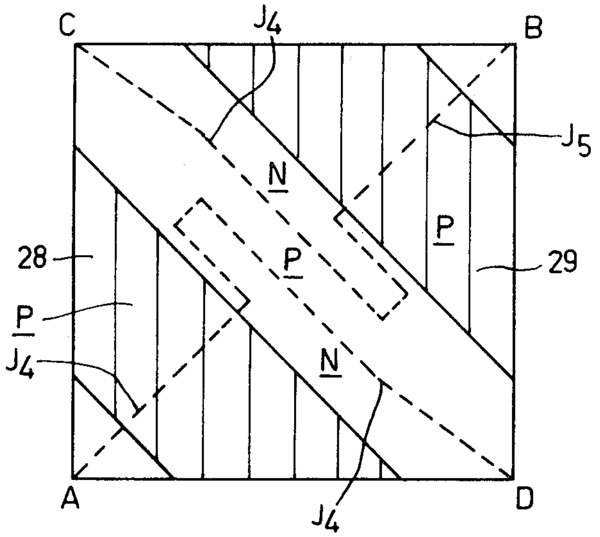
FIG. 10 shows the plan view of the upper side of a further bilateral gate controlled device in accordance with the invention.
Figure 9:
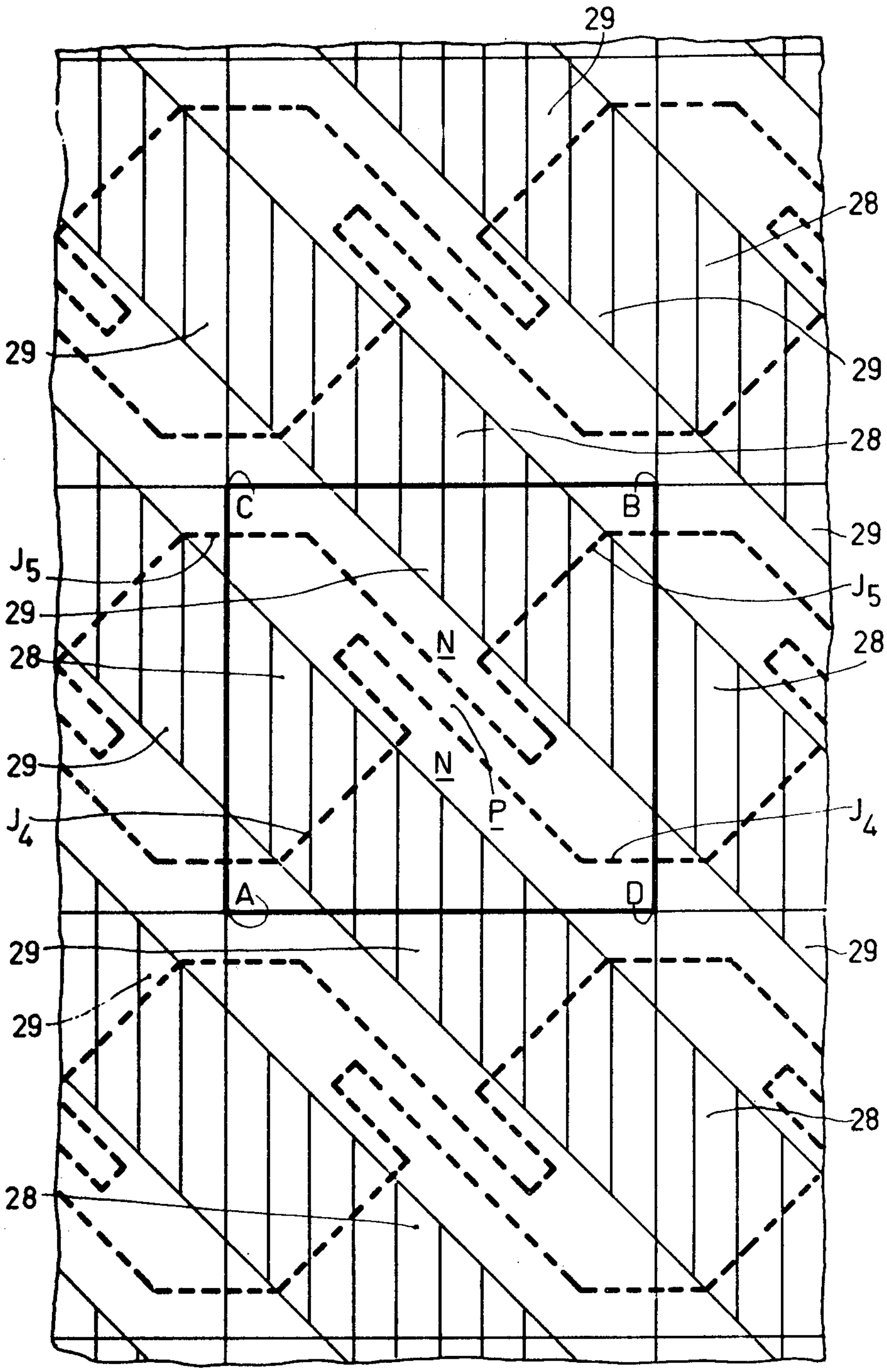
FIG. 9 is a plan view of the upper side of part of silicon body in which a plurality of the device elements as shown in FIGS. 3 to 8 are formed, the Figure showing the body after application of the electrode layers and prior to division into the individual elements.

FIG. 9 of the accompanying drawings shows in plan view the upper side of part of the silicon body after forming the metal layer electrode strips. In the centre of the Figure there is shown a device of square surface area having diagonals A–B and C–D as is shown in FIGS. 3 to 8 and having electrodes 28 and 29 shown cross-hatched. The vertical and horizontal lines represents the location of cutting lines subsequently to be formed with a sawing tool. It is seen from the Figure that the electrodes 28 and 29 in the centre device form part of continuous strips which extend parallel to the diagonal C– D. The strip from which electrode 28 of the centre device is formed also provides electrode 29 in the device immediately below the centre device and then electrode 28 in the device situated immediately to the right of the latter. The strip from which electrode 29 of the centre device is formed also provides electrode 28 of the device immediately above the centre device and electrode 28 of the device immediately on the right of the centre device. From FIG. 9 the form of the diffusion pattern of the n-type zones 25 and 26 over adjoining parts of the slice can be seen. Junctions $J_4$ and $J_5$ both terminate in the two sides A–C and D–B of each device. For optimum symmetry of device characteristics it would be desirable for junction $J_5$ to terminate near the corners C and B and $J_4$ to terminate near the corners A and D. FIG. 10 of the accompanying diagrammatic drawing shows a plan view of the upper side of the semiconductor body of a further embodiment of the invention in which the terminations of the junctions $J_4$ and $J_5$ are at the corners A, D and B, C respectively. Otherwise the device is exactly as described in the embodiment described with reference to FIGS. 3 to 8. The reason for the termination of the junctions $J_4$ and $J_5$ at the side surfaces of the device shown in FIGS. 3 to 9 along the sides A–C can be explained in terms of the masking required to produce the diffusion pattern of the n-type zones 25 and 26 as shown in FIG. 9. If it were desired to make a large plurality of devices as shown in FIG. 10 on a single slice as shown in FIG. 9 then due to the termination of the junctions $J_4$ and $J_5$ at the corners of each elemental portion on the slice the mask used in determining the areas of the oxide layer to be removed for the n-type diffusion would consist of a plurality of isolated apertures, that is, one isolated island for each square site. In contradistinction the mask required to produce the devices shown in FIG. 9 does not have such a plurality of isolated apertures because the junctions $J_4$ and $J_5$ terminate in the side faces of each elemental portion. In fact this mask consists of a plurality of strip-like apertures extending in rows corresponding substantially in area to the continuously extending p-type zones 23 extending in rows across the slice. Although the apertures in the mask used for defining openings in the oxide layer for the diffusion step are more complex in shape than those in the mask used for defining the openings in the oxide layer for the electrode strips, the former mask may still be formed readily by spark erosion due to the continuity of apertures in rows. Thus in manufacture devices as shown in FIG. 9 may be produced more readily, at least as far as this particular masking operation is concerned.

In the manufacture of the device shown in FIGS. 3 to 8, after providing the electrodes as described above, the wafer is then divided along the orthogonal lines as shown in FIG. 9. Division is effected by sawing in the presence of a lapping compound. The individual elements are then subjected to an etching step to remove any mechanical damage effected at the sawn edges. During this etching step the remaining parts of the oxide layer on the upper surface act as a protective mask together with the electrode layers present. Preferably the remaining oxide layer parts on the upper surface are not removed and maintained in the final device to aid the stability. However for the sake of clarity these oxide layer parts are not shown in any of the Figures of the accompanying drawings.

The individual elements are then mounted, eight or ten per SOT-35 comb. The attachment of the lower electrode 27 to the centre terminal pad parts is by direct soldering. Thereafter the further connections between the electrodes 28 and 29 and the further terminal portions of the comb are established either by a direct soldering method using a secondary comb or by wire bonding. Encapsulation in plastics material is then effected for the comb containing eight or ten devices. Finally the individual devices are obtained by cutting of the comb tie bar strip at appropriate locations.

What we claim is:

1. A bilateral gate controlled semiconductor device comprising a semiconductor body having an inner zone of one conductivity type between first and second outer zones of the opposite conductivity type, said first and second outer zones of the opposite conductivity type extending at first and second opposite sides of the body respectively and forming p-n junctions with the inner zone, a first further zone of the one conductivity type forming a p-n junction with the first outer zone of the opposite conductivity type and also extending at said first side of the body, a first main current carrying electrode at said first side of the body in ohmic contact with said first outer zone of the opposite conductivity type and said first further zone of the one conductivity type, second and third further zones of the one conductivity type of substantially equal surface areas each forming a p-n junction with the second outer zone of the opposite conductivity type and each extending at said second side of the body, two further electrodes at said second side of the body for constituting a second main current carrying electrode and a gate electrode or vice versa according to the circuit connection of these electrodes, one of said further electrodes forming a common ohmic contact to the second outer zone of the opposite conductivity type and the second further zone of the one conductivity type and the other of said further electrodes forming a common ohmic contact to the second outer zone of the opposite conductivity type and the third further zone of the one conductivity type, the shape and position of the first further zone of the one conductivity type at the first side of the body and the second and third further zones of the one conductivity type at the second side of the body being such that the device has substantially the same characteristics for each of the two alternative circuit connections of the two further electrodes.

2. A bilateral gate controlled semiconductor device as claimed in claim 1, wherein the semiconductor body is of generally rectangular surface configuration, the second and third further zones of the one conductivity type where they extend at the second side of the body being substantially symmetrically disposed with respect to a line which bisects the rectangular surface at said second side.

3. A bilateral gate controlled semiconductor device as claimed in claim 2, wherein the second and third zones of the one conductivity type where they extend at the second side of the body are substantially symmetrically disposed with respect to a diagonal line between opposite corners of the rectangular surface at said second side.

4. A bilateral gate controlled semiconductor device as claimed in claim 3, wherein the two further electrodes at the said second side of the body are in the form of metal strips of substantially uniform width which extend in a direction substantially parallel to the diagonal line.

5. A bilateral gate controlled semiconductor device as claimed in claim 3, wherein the second and third further zones of the one conductivity type each have a first peripheral portion and a second peripheral portion, the p-n junction parts between the first peripheral portions and the second outer zone of the opposite conductivity type extending on opposite sides of and in a direction substantially parallel to the diagonal line and the p-n junction parts between the second peripheral portions and the second outer zone extending on opposite sides of and in a direction away from the diagonal line, and with respect to the direction between the first and second sides of the body the first peripheral portions of the second and third further zones of the one conductivity type at the second side of the body are in overlapping relationship with the first further zone of the one conductivity type at the first side of the body and the second peripheral portions of the second and third further zones of the one conductivity type at the second side of the body at least for a part of their length extending adjacent to the first peripheral portions are in non-overlapping relationship with the first outer zone of the one conductivity type at the first side of the body.

6. A bilateral gate controlled semiconductor device, as claimed in claim 5, wherein with respect to the direction between the first and second sides each further electrode at the said second side of the body is laterally spaced from the area of overlap of the first further zone of the one conductivity type at the first side of the body with the first peripheral portion of the respective second or third further zone of the one conductivity type at the second side of the body contacted by the respective electrode.

7. A bilateral gate controlled semiconductor device as claimed in claim 3, the second and third further zones of the one conductivity type each have a peninsular portion, said peninsular portions extending generally parallel to the diagonal line in opposite directions and defining between the second and third further zones of the one conductivity type a portion of the second outer zone of the opposite conductivity type having a larger dimension in the direction parallel the diagonal line than in the direction transverse to said diagonal line.

8. A bilateral gate controlled semiconductor device, as claimed in claim 7, wherein said portion of the second outer zone of the opposite conductivity type is of generally rectangular surface area at the second side of the body and the ratio $l/w$ is at least 6, where $l$ is the length of said portion measured in a direction parallel to the diagonal line between the ends of the peninsular portions and $w$ is the width of said portion of the second outer zone measured in a direction transverse to the diagonal line between the facing edges of the second and third further zones of the one conductivity type.

9. A bilateral gate controlled semiconductor device as claimed in claim 7, wherein the first further zone of the one conductivity type at the first side of the body has two recessed portions which with respect to the direction between the first and second sides of the body are situated in the proximity of the peninsular portions of the second and third further zones of the one conductivity type at the second side of the body.

* * * * *